(12) United States Patent
Tsutsumi

(10) Patent No.: US 9,722,587 B2
(45) Date of Patent: Aug. 1, 2017

(54) POWER SUPPLY CIRCUIT

(71) Applicant: Rohm Co., Ltd., Kyoto (JP)

(72) Inventor: Keisuke Tsutsumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/215,231

(22) Filed: Jul. 20, 2016

(65) Prior Publication Data

US 2017/0033776 A1 Feb. 2, 2017

(30) Foreign Application Priority Data

Jul. 31, 2015 (JP) ................................. 2015-152300

(51) Int. Cl.
*H03K 5/08* (2006.01)
*G11C 5/14* (2006.01)
*H02M 1/00* (2006.01)

(52) U.S. Cl.
CPC .............. *H03K 5/08* (2013.01); *G11C 5/147* (2013.01); *H02M 1/00* (2013.01)

(58) Field of Classification Search
CPC ........... G11C 5/147; H03K 5/08; H02M 1/32; H02M 3/156
USPC .......... 327/323, 306, 333; 323/350, 268, 285
See application file for complete search history.

(56) References Cited

U.S. PATENT DOCUMENTS

| 7,061,213 B2* | 6/2006 | Yoshida | H02M 3/156 323/224 |
| 7,928,714 B2* | 4/2011 | Wong | H02M 3/156 323/241 |
| 8,044,642 B2* | 10/2011 | Sakai | H02M 3/1588 323/224 |
| 8,432,656 B2* | 4/2013 | Zambetti | H02M 3/156 323/268 |
| 2004/0104714 A1 | 6/2004 | Nishimaki | |

FOREIGN PATENT DOCUMENTS

| JP | 2000-92824 | 3/2000 |
| JP | 2004-56982 | 2/2004 |
| JP | 2004-88950 | 3/2004 |

* cited by examiner

*Primary Examiner* — Dinh T Le
(74) *Attorney, Agent, or Firm* — Fish & Richardson P.C.

(57) ABSTRACT

A power supply circuit has, for example, an overshoot suppressor 100, a control circuit 10, a first transistor M1, a second transistor M2, an inductor L, a capacitor C1, resistors R1 and R2, and an error amplifier ERR. As the load becomes light, the ON-period of the second transistor M2 increases. When the load RL turns from a heavy load to a light or no load, the overshoot suppressor 100 detects an increase in the ON-period of the second transistor M2, and then forcibly turns OFF the second transistor M2. Thus, an overshoot in the output voltage Vo is suppressed. Detecting an increase in the period for which the driving signal S2 remains at high level H helps reduce malfunctioning due to noise.

18 Claims, 5 Drawing Sheets

US 9,722,587 B2

POWER SUPPLY CIRCUIT

CROSS-REFERENCE TO RELATED APPLICATIONS

This application is based on Japanese Patent Application No. 2015-152300 filed on Jul. 31, 2015, the contents of which are hereby incorporated by reference.

BACKGROUND OF THE INVENTION

1. Field of the Invention

The present invention relates to a power supply circuit of a synchronous rectification type that offers fast response to a variation in load.

2. Description of Related Art

Power supply circuits are used in power supplies for PCs (personal computers), power supplies for servers, power supplies for FPGAs (field-programmable gate arrays), power supplies for SOCs (systems-on-a-chip), power supplies for OA (office automation) appliances, etc. In a power supply circuit, through switching operation whereby transistors are turned ON and OFF in accordance with variations in load and in input, the output voltage as a supply voltage is stabilized. This helps reduce wasted electric power, leading to improved energy efficiency. One example of such efficient power supply circuits is switching regulators of a synchronous rectification type that employ a CMOS (complementary metal-oxide-semiconductor transistor) integrated circuit.

Patent Document 1 (Japanese Patent Application Publication No. 2004-88950) discloses a power supply circuit in which the output voltage is compared with a reference voltage, then an error signal is fed back to a PWM (pulse-width modulation) circuit, and then the pulse width of a PWM signal is controlled according to the error signal; thereby a CMOS inverter is controlled so as to keep the output voltage constant.

Patent Document 2 (Japanese Patent Application Publication No. 2004-56982) discloses a power supply circuit in which the output voltage of a CMOS inverter is monitored to detect if it has recovered from an undershoot and exceeded a reference potential, then a signal indicating the magnitude of the load current is fed back to a PWM circuit, and then the pulse width of PWM is controlled; thereby the output voltage is made to cope with variations in load.

Patent Document 3 (Japanese Patent Application Publication No. 2000-92824) discloses a power supply circuit in which the direction of the current passing through a smoothing circuit is detected, and a switch is forcibly turned OFF so as to reduce direct-current power loss when the load current is high.

FIG. 4 is a circuit diagram showing a power supply circuit, different from any of those disclosed in Patent Documents 1 to 3, that came to the knowledge of the present inventor. The power supply circuit shown in FIG. 4 is composed of a control circuit 10a, a first transistor M1a, a second transistor M2a, an inductor La, a capacitor Ca, a resistor Ra, a resistor Rb, a comparator CMPa, and an error amplifier ERRa. Between a source S and a drain D of the first transistor M1a, a parasitic diode D1a is formed. Between a source S and a drain D of the second transistor M2a, a parasitic diode D2a is formed.

The control circuit 10a outputs driving signals S1a and S2a to turn ON and OFF the first and second transistors M1a and M2a alternately. Thus, a rectangular-wave voltage is output to a node Na. The rectangular-wave voltage and the inductor La cause a triangular-wave current ILa to pass through the inductor La. The triangular-wave current ILa is smoothed by the capacitor Ca, and an output voltage Voa is produced at an output terminal OUT. Thus, when a load RL is connected to the output terminal OUT, an output current ba is output. The load RL is, for example, a CPU. The output voltage Voa at the output terminal OUT is divided by the resistors Ra and Rb, and thereby a feedback voltage Vfba is produced at a node Nc. The error amplifier ERRa compares the feedback voltage Vfba with a reference voltage Vrefa, and outputs a control signal Vera that reflects the result of the comparison. The control signal Vera is fed to the control circuit 10a. Based on the control signal Vera fed to it, the control circuit 10a controls the switching of the first and second transistors M1a and M2a so that the output current ba remains constant.

In the power supply circuit shown in FIG. 4, when the load RL connected to the output terminal OUT turns from a heavy load to a light or no load, the output current boa passing through the output terminal OUT decreases, and thus the output voltage Voa rises. This is called an overshoot. Poor response to a variation in load cause a large overshoot. With the power supply circuit shown in FIG. 4, when the load RL connected to the output turns from a heavy load to a light or no load and the feedback voltage Vfba exceeds the value of the reference voltage Vrefa, a detection signal Vcma output from the comparator CMPa turns from high level H to low level L. The reference voltage Vrefa is set at a level higher than the feedback voltage Vfba. In response to the detection signal Vcma at low level L, the control circuit 10a turns the driving signal S2 to low level L to forcibly turn OFF the second transistor M2a. This reduces the overshoot in the feedback voltage Vfba. For the purpose of turning OFF the second transistor M2a when the load RL turns from a heavy load to a light or no load, the polarity of the detection signal Vcma output from the comparator CMPa does not matter: it may be at low level L or at high level H.

FIG. 5 is a timing chart of the power supply circuit shown in FIG. 4. Now, with reference to FIGS. 4 and 5, the circuit operation of the power supply circuit will be described.

From time point T0 to time point T6, by the driving signals S1a and S2a, the first and second transistors M1a and M2a are kept turning ON and OFF alternately, with a result that a triangular-wave current passes through the inductor La. The triangular-wave current is smoothed by the capacitor Ca, so that a constant output current ba passes through the output terminal OUT.

From time point T6 to time point T7a, the load RL connected to the output terminal OUT turns from a heavy load to a light or no load. Thus, the output current Ioa passing through the output terminal OUT decreases. As a result, the output voltage Voa rises, and accordingly the feedback voltage Vfba rises. At this time, the feedback voltage Vfba is lower than the reference voltage Vrefa, and thus the second transistor M2a is kept ON.

At time point T8a, the level of the feedback voltage Vfba exceeds the level of the reference voltage Vrefa, and the comparator CMPa turns the detection signal Vcma from high level H to low level L. Based on the detection signal Vcma, the control circuit 10a turns the driving signal S2a from high level H to low level L. Thus, the second transistor M2a is forcibly turned OFF. As a result, the current path leading through the ground terminal GND back to the inductor La is cut off, and thus the current ILa passing through the inductor La decreases faster. That is, the current ILa passing through the inductor La decreases faster when the second transistor M2a is turned to OFF than when the second transistor M2a is kept ON. As a result, an overshoot in the feedback voltage Vfba is suppressed. When the second transistor M2a is ON, the current ILa takes a path ILa1 and the feedback voltage Vfba takes a path Vfba1; when the second transistor M2a is turned OFF, the current IL takes a path ILa2, and the feedback voltage Vfba takes a path Vfba2.

After time point T8a, when the feedback voltage Vfba becomes lower than a reference voltage Vrefb, the error amplifier ERRa turns the control signal Vera from low level L to high level H. Based on the control signal Vera, the control circuit 10a turns the driving signal S1a from low level L to high level H, and turns the driving signal S2a from high level H to low level L. Thus, the first transistor M1a is turned from OFF to ON, and the second transistor M2a is turned from ON to OFF. Thereafter, the first and second transistors M1a and M2a are so controlled as to keep turning ON and OFF complementarily. Here, "complementarily" is assumed to cover not only operation where the ON/OFF states of the first and second transistors M1a and M2a are completely reversed, but also operation where, with a view to preventing a through current, the first and second transistors M1a and M2a are shifted between the ON and OFF states with a delay with respect to each other.

As described above, in the power supply circuit shown in FIG. 4, the output voltage Voa at the output terminal OUT is divided to produce the feedback voltage Vfba, and the feedback voltage Vfba is compared with the reference voltage Vrefa to detect an overshoot in the output voltage Voa.

In the power supply circuit disclosed in Patent Document 1, the CMOS inverter is controlled so that the output voltage is constant. This achieves fast response to a variation in load. However, no mention is made of a measure against an overshoot in the output voltage.

In the power supply circuit disclosed in Patent Document 2, the pulse width of PWM is controlled to make the output voltage cope with a variation in load. However, no mention is made of a measure against an overshoot in the output voltage.

In the power supply circuit disclosed in Patent Document 3, the direction of the current passing through the smoothing circuit is detected, and the switch is forcibly turned OFF so as to reduce direct-current power loss when the load current is high. However, no mention is made of a measure against an overshoot in the output voltage.

In the power supply circuit shown in FIG. 4, to further reduce an overshoot in the output voltage Voa, it is preferable that the divided feedback voltage Vfba be as close to the reference voltage Vrefa as possible. In that case, however, noise resulting from the switching of the first and second transistors M1a and M2a, or extraneous noise, may cause the feedback voltage Vfba to exceed the reference voltage Vrefa. This inconveniently leads to malfunctioning of the control circuit 10a.

SUMMARY OF THE INVENTION

In view of the above-mentioned problems encountered by the present inventor, the invention disclosed herein aims to provide a power supply circuit that is free of malfunctioning due to noise, that operates with a suppressed overshoot, and that offers fast response to a variation in load.

According to one aspect of what is disclosed herein, a power supply circuit includes: a first transistor connected between a high-potential terminal and a first node; a second transistor connected between a low-potential terminal and the first node; and a smoothing circuit connected between the first node and the low-potential terminal. The power supply circuit may moreover include a control circuit configured to turn ON and OFF the first and second transistors alternately such that the output voltage at an output terminal connected to the smoothing circuit equals a predetermined voltage. The power supply circuit may further include an overshoot suppressor configured to turn OFF the second transistor on detecting an increase in the ON-period of the second transistor as observed when the second transistor is turned ON this time compared with the ON-period of the second transistor as observed when the second transistor was turned ON last time.

According to another aspect of what is disclosed herein, a power supply circuit, includes: an inductor connected between a high-potential terminal and a first node; a first transistor connected between a low-potential terminal and the first node; a second transistor connected between the first node and an output terminal; and a first capacitor connected between the output terminal and the low-potential terminal. The power supply circuit may moreover include a control circuit configured to turn ON and OFF the first and second transistors alternately such that the output voltage at the output terminal equals a predetermined voltage. The power supply circuit may further include an overshoot suppressor configured to turn OFF the second transistor on detecting an increase in the ON-period of the second transistor as observed when the second transistor is turned ON this time compared with the ON-period of the second transistor as observed when the second transistor was turned ON last time.

Other features, elements, steps, benefits, and characteristics of the present invention will become clearer with reference to the following description of preferred embodiments thereof in conjunction with the accompanying drawings.

DETAILED DESCRIPTION OF PREFERRED EMBODIMENTS

First Embodiment: A first embodiment of the present invention will be described below with reference to the accompanying drawings.

Figure 1:
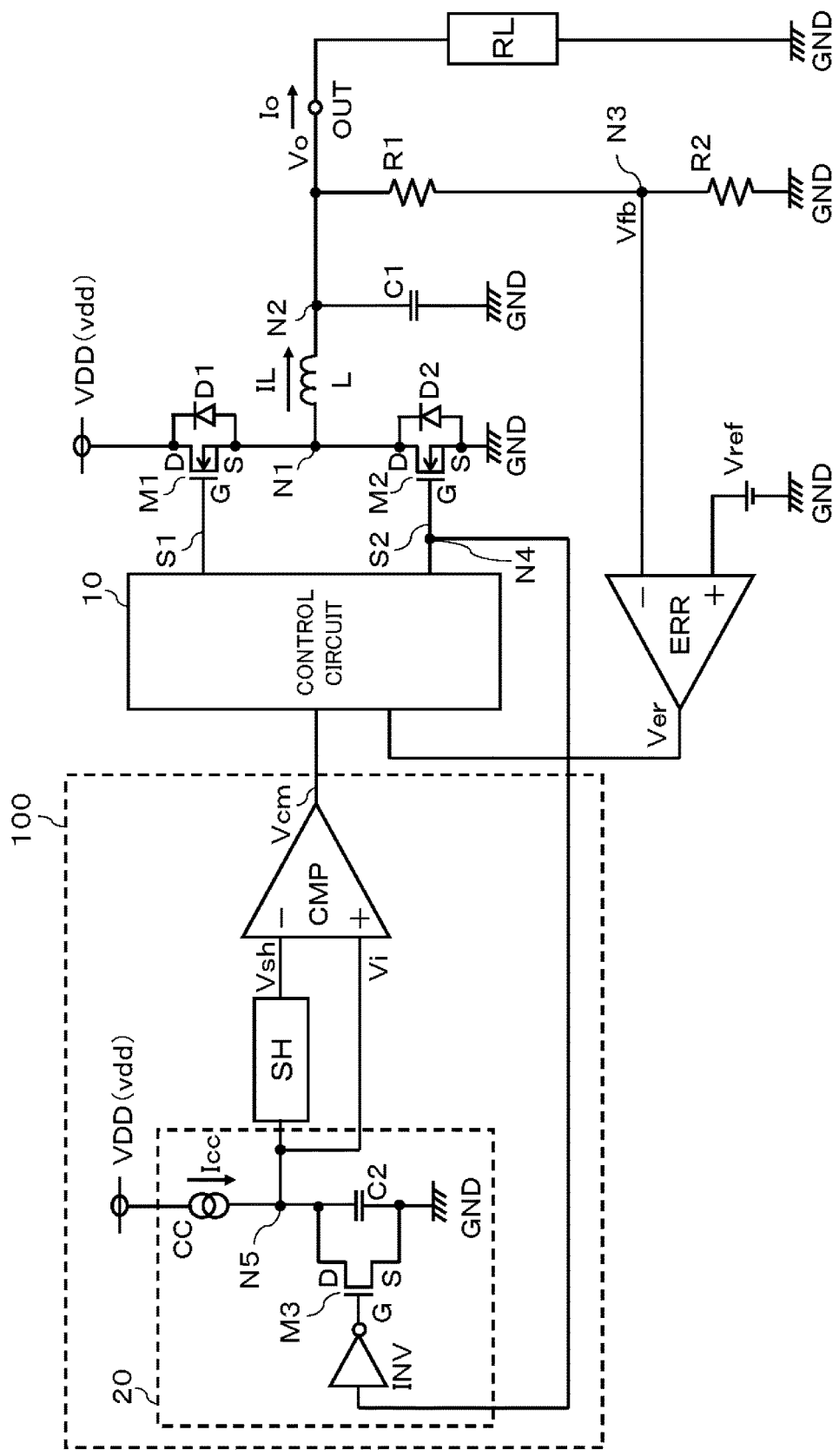
FIG. 1 is a circuit diagram of a power supply circuit according to a first embodiment of the present invention.

FIG. 1 is a circuit diagram of a power supply circuit according to the first embodiment of the present invention. The power supply circuit shown in FIG. 1 is a step-down DC/DC converter.

In FIG. 1, the power supply circuit is composed of an overshoot suppressor 100, a control circuit 10, a first transistor M1, a second transistor M2, an inductor L, a capacitor C1, a resistor R1, a resistor R2, and an error amplifier ERR. Between a source S and a drain D of the first transistor M1, a parasitic diode D1 is formed. Between a source S and a drain D of the second transistor M2, a parasitic diode D2 is formed. The inductor L and the capacitor C1 constitute a smoothing circuit. Driving signals S1 and S2 have a frequency of, for example, 100 kHz to 10 MHz. The inductor L has an inductance of, for example, 0.1 μH to 10 μH. The capacitor C1 has a capacitance of, for example, 1 μF to 100 μF. The resistors R1 and R2 have a resistance of, for example, 1 kΩ to 1000 kΩ.

The first and second transistors M1 and M2 can both be NMOS transistors (N-channel metal-oxide-semiconductor field-effect transistors). Instead, the first transistor M1 may be a PMOS transistor (P-channel metal-oxide-semiconductor field-effect transistor) and the second transistor M2 may be an NMOS transistor. In a case where the first transistor M1 is an NMOS transistor, the control circuit 10 includes a bootstrap circuit (unillustrated). The first and second transistors M1 and M2 may instead be bipolar transistors.

The overshoot suppressor 100 serves to control the second transistor M2. The overshoot suppressor 100 is composed of a pulse width-voltage converter 20, a sample-and-hold circuit SH, and a comparator CMP. The pulse width-voltage converter 20 is composed of an inverter INV, a third transistor M3, a capacitor C2, and a constant current source CC. The inverter INV functions as a polarity adjuster and as a buffer. A plurality of stages of inverters INV may be used, or no inverter at all may be used. Instead of the constant current source CC, a resistor may be used. The capacitor C2 has a capacitance of, for example, several picofarads to several tens of picofarads. The constant current source CC supplies a constant current Icc of, for example, several microamperes to several tens of microamperes. The third transistor M3 corresponds to a switch recited in the appended claims. The constant current source CC corresponds to a current supplier recited in the appended claims.

The control circuit 10 turns ON and OFF the first and second transistors M1 and M2 alternately through pulse-width modulation (PWM) control or through pulse-frequency modulation (PFM).

Next, a description will be given of the circuit configuration of, and the component interconnection in, the power supply circuit shown in FIG. 1.

One output terminal of the control circuit 10 is connected to a gate G of the first transistor M1. Another output terminal of the control circuit 10 is connected via a node N4 to a gate G of the second transistor M2. The drain D of the first transistor M1 is connected to a power terminal (high-potential terminal) VDD. The source S of the first transistor M1 is connected to a node N1. The drain D of the second transistor M2 is connected to the node N1. The source S of the second transistor M2 is connected to a ground terminal (low-potential terminal) GND. The inductor L is connected between the node N1 and a node N2. The capacitor C1 is connected between the node N2 and the ground terminal GND. The node N2 is connected to an output terminal OUT. To the output terminal OUT, a load RL is connected. Connected as the load RL is, for example, a CPU. An output current Io of, for example, 1A to 10A passes through the output terminal OUT.

The resistor R1 is connected between the node N2 and a node N3. The resistor R2 is connected between the node N3 and the ground terminal GND. An inverting input terminal (−) of the error amplifier ERR is connected to the node N3. To a non-inverting input terminal (+) of the error amplifier ERR, a reference voltage Vref is applied. An output terminal of the error amplifier ERR is connected to one input terminal of the control circuit 10.

An input terminal of the inverter INV is connected to the node N4. An output terminal of the inverter INV is connected to a gate G of the third transistor M3. Between a drain D of the third transistor M3 and the ground terminal GND, the capacitor C2 is connected. A source S of the third transistor M3 is connected to the ground terminal GND. A drain D of the third transistor M3 is connected to a node N5. The constant current source CC is connected between the power terminal VDD and the node N5. An input terminal of the sample-and-hold circuit SH and a non-inverting input terminal (+) of the comparator CMP are connected to the node N5. An output terminal of the sample-and-hold circuit SH is connected to an inverting input terminal (−) of the comparator CMP. An output terminal of the comparator CMP is connected to another input terminal of the control circuit 10. The third transistor M3, the capacitor C2, and the constant current source CC constitute an integrating circuit, and generate triangular or sawtooth waves. The integrating circuit may instead be configured as a mirror integrating circuit.

Next, a description will be given of the signal flow in, and the circuit operation of, the power supply circuit shown in FIG. 1.

The control circuit 10 outputs driving signals S1 and S2. The driving signals S1 and S2 are fed to the gates G of the first and second transistors M1 and M2 respectively. Thus, the first and second transistors M1 and M2 are turned ON and OFF alternately so that a current IL passes through the inductor L. The current IL is smoothed by the capacitor C1, and thereby an output voltage Vo is produced. When the load RL is connected to the output terminal OUT, an output current To is output. The output voltage Vo at the output terminal OUT is divided by the resistors R1 and R2, and thereby a feedback voltage Vfb is produced at the node N3. The error amplifier ERR compares the feedback voltage Vfb with the reference voltage Vref, and outputs a control signal Ver that reflects the result of the comparison. Based on the control signal Ver, the control circuit 10 controls the driving signals S1 and S2 to give them a predetermined pulse width or a predetermined frequency, and outputs the so controlled driving signals S1 and S2 to turn ON and OFF the first and second transistors M1 and M2 alternately.

The driving signal S2 output from the control circuit 10 is fed also to the inverter INV, where it is inverted. The output signal of the inverter INV is fed to the gate G of the third transistor M3. Based on the output signal of the inverter INV, the third transistor M3, the capacitor C2, and the constant current source CC generate an integral signal Vi at the node N5. The integral signal Vi is fed to the input terminal of the sample-and-hold circuit SH and to the non-inverting input terminal (+) of the comparator CMP. The integral signal Vi has an amplitude that is proportional to the pulse width of the driving signal S2. The sample-and-hold circuit SH holds the peak value of the integral signal Vi fed to it, and outputs, as a held signal Vsh, the value that was held last time. The held signal Vsh is fed to the inverting input terminal (−) of the comparator CMP. The comparator CMP compares the integral signal Vi with the held signal Vsh, and outputs a detection signal Vcm that is either at low level L or at high level H at a time. The detection signal Vcm is fed to the control circuit 10.

When the integral signal Vi rises above the held signal Vsh, the detection signal Vcm turns to high level H. When the integral signal Vi is equal to or lower than the held signal Vsh, the detection signal Vcm is at low level L. When the detection signal Vcm turns to high level H, the control circuit 10 turns the driving signal S2 to low level L to forcibly turn OFF the second transistor M2. Thus, the second transistor M2 is forcibly turned OFF. On the other hand, when the detection signal Vcm is at low level L, the first and second transistors M1 and M2 keep turning ON and OFF complementarily. Here, "complementarily" is assumed to cover not only operation where the ON/OFF states of the first and second transistors M1 and M2 are completely reversed, but also operation where, with a view to preventing a through current, the first and second transistors M1 and M2 are shifted between the ON and OFF states with a delay with respect to each other.

When the load RL connected to the output terminal OUT turns sharply from a heavy load to a light or no load, the output current Io that passes through the output terminal OUT decreases. Accordingly, the output voltage Vo at the output terminal OUT rises, and thus the feedback voltage Vfb rises. When the feedback voltage Vfb rises above the reference voltage Vref, the control signal Ver of the error amplifier ERR turns from high level H to the low level L. Thus, the control circuit 10 turns the driving signal S2 to high level H. As a result, the second transistor M2 turns ON. Moreover, the output signal of the inverter INV turns to low level L, and thus the third transistor M3 turns OFF. Now, the constant current Icc from the constant current source CC charges the capacitor C2. Thus, the level of the integral signal Vi rises. The sample-and-hold circuit SH holds the peak value of the integral signal Vi, and outputs the previously held value as the held signal Vsh. The comparator CMP compares the integral signal Vi with the held signal Vsh, and turns the detection signal Vcm to high level H when the integral signal Vi rises above the held signal Vsh. Thus, the control circuit 10 turns the driving signal S2 to low level L. Thus, the second transistor M2 is forcibly turned OFF.

As a result, the output current To passing through the output terminal OUT decreases, and thereby an overshoot in the output voltage Vo is suppressed. That is, the overshoot suppressor 100 detects an abrupt change in the load RL from a heavy load to a light or no load and the resulting increase in the ON-period of the second transistor M2, and then forcibly turns OFF the second transistor M2. In this way, an overshoot in the output voltage Vo is suppressed.

When the load RL connected to the output terminal OUT changes gently from a heavy load to a light or no load, the level of the held signal Vsh output from the sample-and-hold circuit SH, which has the previously held value, is almost equal to the level of the integral signal Vi, and thus the comparator CMP holds the detection signal Vcm at low level L. Thus, the second transistor M2 is not forcibly turned OFF. Thus, when the output voltage Vo varies gently due to normal operation of the load RL connected to the output terminal OUT, the second transistor M2 is not forcibly turned OFF. Incidentally, if the second transistor M2 is forcibly turned OFF as a result of a change in the output voltage Vo due to normal operation of the load RL, the feedback voltage Vfb falls below the reference voltage Vref, and thereby the second transistor M2 recovers from the OFF state.

Figure 2:
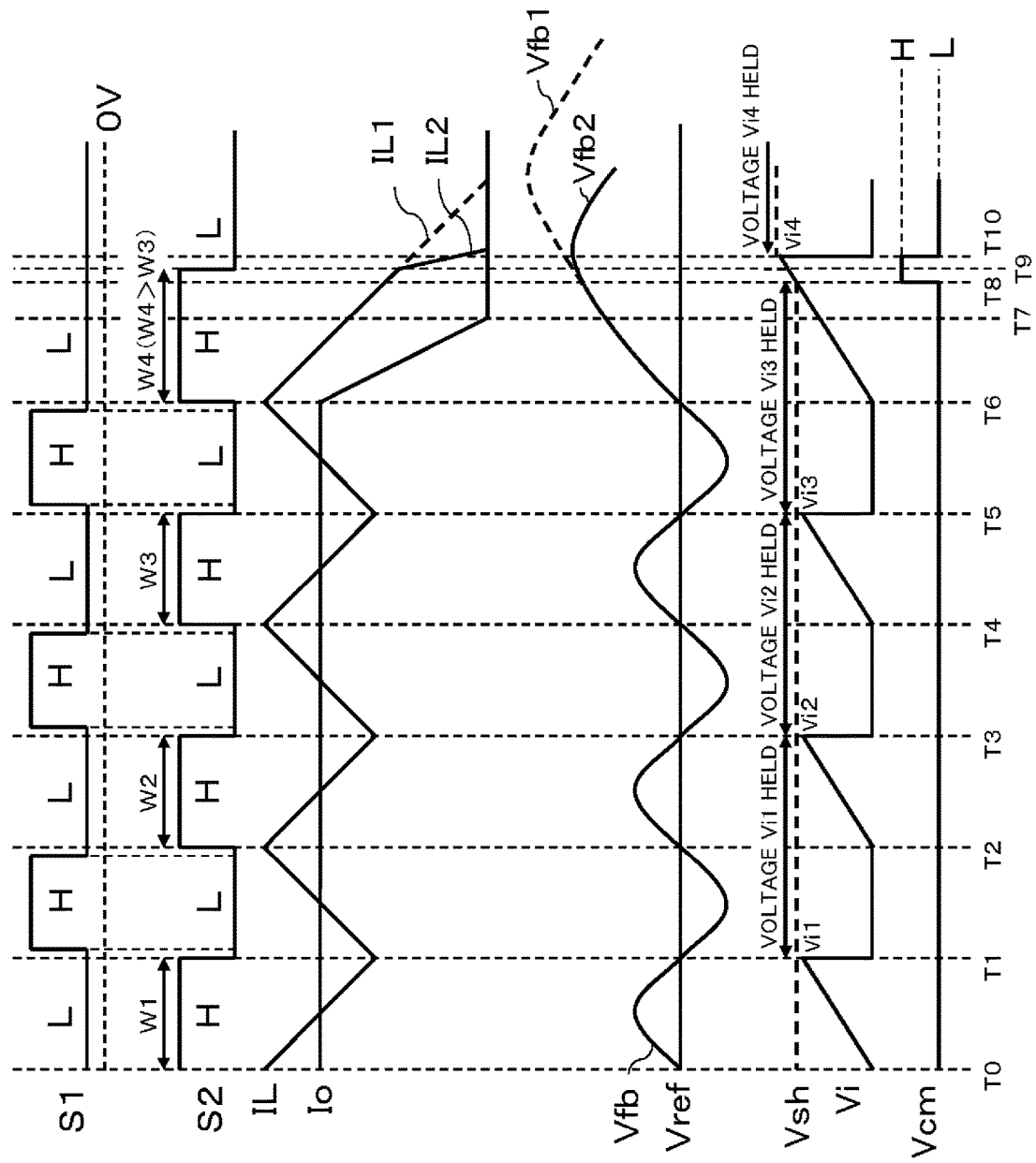
FIG. 2 is a timing chart of the power supplies according to the first embodiment of the present invention.

FIG. 2 is a timing chart of the power supply circuit shown in FIG. 1 according to the first embodiment of the present invention. The circuit operation of the power supply circuit will now be described with reference to FIG. 2.

From time point T0 to time point T1, the driving signal S1 is at low level L. Here, the low level L of the driving signal S1 is set not at a zero potential but at a voltage approximately equal to the voltage at the node N1. The driving signal S2 is at high level H. The first transistor M1 is OFF, and the second transistor M2 is ON; thus, the current IL passing through the inductor L decreases. The third transistor M3 is OFF; thus, the capacitor C2 is charged, and the level of the integral signal Vi rises gradually. At time point T1, the sample-and-hold circuit SH holds the peak value Vi1 of the integral signal Vi.

From time point T1 to time point T2, the driving signal S1 is at high level H. Here the high level H of the driving signal S1 is set at, for example, a voltage 3 V to 5 V higher than the supply voltage vdd at the power terminal VDD. Such a voltage is produced through stepping-up operation by the bootstrap circuit mentioned above. The driving signal S2 is at low level L. The first transistor M1 is ON, and the second transistor M2 is OFF; thus, the current IL passing through the inductor L increases. The third transistor M3 is ON; thus, the capacitor C2 is discharged, and the level of the integral signal Vi falls. Here, the ON-OFF transition of the first transistor M1 takes place while the second transistor M2 is OFF. This prevents a through current that may pass through the first and second transistors M1 and M2.

From time point T2 to time point T3, the driving signal S1 is at low level L. The driving signal S2 is at high level H. The first transistor M1 is OFF, and the second transistor M2 is ON; thus, the current IL passing through the inductor L decreases. The third transistor M3 is OFF; thus, the capacitor C2 is charged, and the level of the integral signal Vi rises gradually. At time point T3, the sample-and-hold circuit SH holds the peak value Vi2 of the integral signal Vi. Moreover, the peak value Vi1 of the integral signal Vi that was previously held by the sample-and-hold circuit SH is output as the held signal Vsh from the sample-and-hold circuit SH. The comparator CMP compares the held signal Vsh with the integral signal Vi. From time point T2 to time point T3, the level of the integral signal Vi does not rise above the level of the held signal Vsh, and thus the detection signal Vcm remains at low level L.

From time point T3 to time point T4, the driving signal S1 is at high level H. The driving signal S2 is at low level L. The first transistor M1 is ON, and the second transistor M2 is OFF; thus, the current IL passing through the inductor L increases. The third transistor M3 is ON; thus, the capacitor C2 is discharged, and the level of the integral signal Vi falls.

From time point T4 to time point T5, the driving signal S1 is at low level L. The driving signal S2 is at high level H. The first transistor M1 is OFF, and the second transistor M2 is ON; thus, the current IL passing through the inductor L decreases. The third transistor M3 is OFF; thus, the capacitor C2 is charged, and the level of the integral signal Vi rises gradually. At time point T3, the sample-and-hold circuit SH holds the peak value Vi3 of the integral signal Vi. Moreover, the peak value Vi2 of the integral signal Vi that was previously held by the sample-and-hold circuit SH is output as the held signal Vsh from the sample-and-hold circuit SH. The comparator CMP compares the held signal Vsh with the integral signal Vi. From time point T4 to time point T5, the level of the integral signal Vi does not rise above the level of the held signal Vsh, and thus the detection signal Vcm remains at low level L.

From time point T5 to time point T6, the driving signal S1 is at high level H. The driving signal S2 is at low level L. The first transistor M1 is ON, and the second transistor M2 is OFF; thus, the current IL passing through the inductor L increases. The third transistor M3 is ON; thus, the capacitor C2 is discharged, and the level of the integral signal Vi falls.

From time point T6 to time point T7, the load connected to the output terminal OUT turns from a heavy load to a light or no load. Thus, the output current Io passing through the output terminal OUT decreases. As a result, the output voltage Vo rises, and accordingly the feedback voltage Vfb rises. Now, the period for which the feedback voltage Vfb remains higher than the reference voltage Vref is longer than under a heavy load, and thus the second transistor M2 continues being kept ON. Thus, the level of the integral signal Vi continues rising. The comparator CMP compares the held signal Vsh with the integral signal Vi.

At time point T8, when the level of the integral signal Vi exceeds the level of the held signal Vsh, the detection signal Vcm rises to high level H.

At time point T9, the driving signal S2 output from the control circuit 10 falls to low level L. Thus, the second transistor M2 is forcibly turned OFF. As a result, the current path leading through the ground terminal GND back to the inductor L is cut off, and thus the current IL passing through the inductor L decreases faster. That is, the current IL passing through the inductor L decreases faster when the second transistor M2 is turned to OFF than when the second transistor M2 is kept ON. As a result, an overshoot in the feedback voltage Vfb is suppressed. When the second transistor M2 is ON, the current IL takes a path IL1 and the feedback voltage Vfb takes a path Vfb1; when the second transistor M2 is turned OFF, the current IL takes a path IL2, and the feedback voltage Vfb takes a path Vfb2.

At time point T10, the detection signal Vcm falls to low level L. This turns the third transistor M3 ON. Thus, the capacitor C2 is discharged, and the level of the integral signal Vi stops rising. Thus, the detection signal Vcm falls to low level L.

As described above, the control circuit 10 detects an increase in the period for which the driving signal S2 remains at high level H, and then turns the driving signal S2 to low level L. Thus, the second transistor M2 is forcibly turned OFF. In this way, an overshoot in the output voltage Vo at the output terminal OUT is suppressed.

Figure 4:
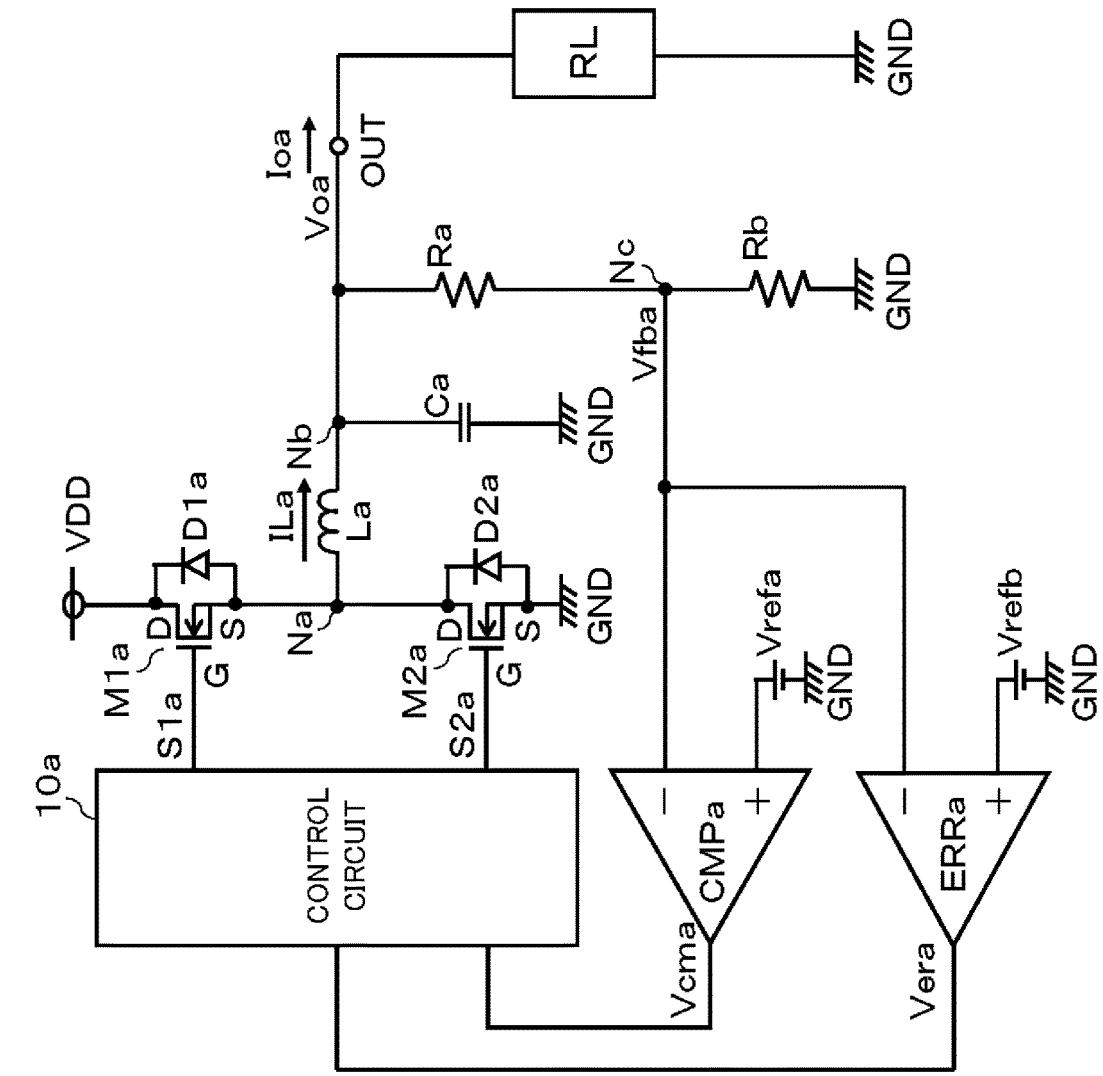
FIG. 4 is a circuit diagram of a conventional power supply circuit.
Figure 5:
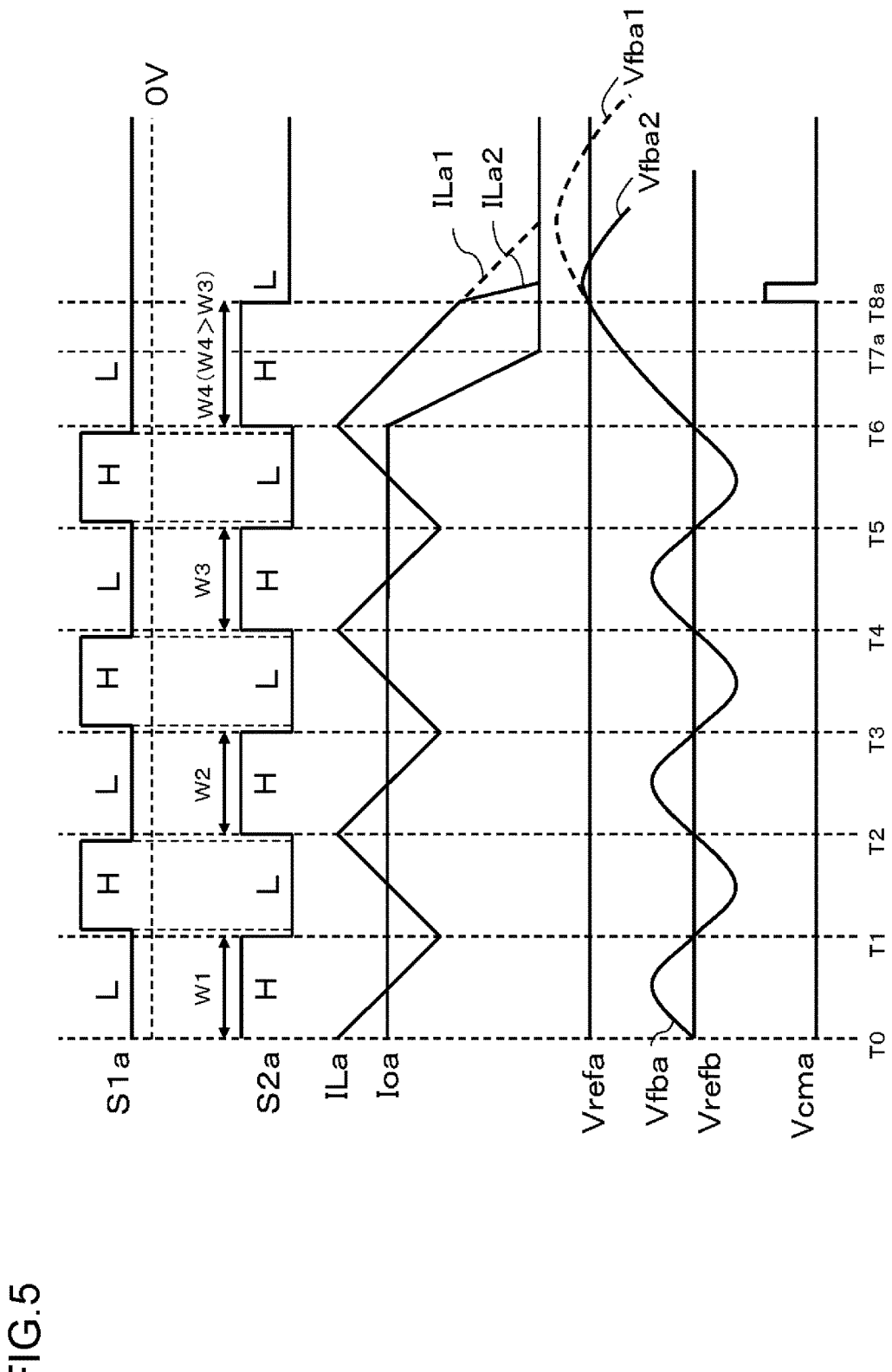
FIG. 5 is a timing chart of the conventional power supply circuit.

With the step-down DC/DC converter shown in FIG. 4, if the feedback voltage Vfba and the reference voltage Vrefa are set at values that are close to each other, malfunctioning due to noise is likely. By contrast, with the step-down DC/DC converter shown in FIG. 1 according to the first embodiment of the present invention, instead of a comparator CMPa being provided, an increase in the period for which the driving signal S2 output from the control circuit 10 remains at high level H is detected, and this makes malfunctioning due to noise less likely.

Moreover, with the step-down DC/DC converter shown in FIG. 4, if there is a large difference between the feedback voltage Vfba and the reference voltage Vrefa that are fed to the comparator CMPa, unless a large rise occurs in the output voltage Voa, the feedback voltage Vfba does not exceed the reference voltage Vrefa, and thus an overshoot in the output voltage Vo cannot be detected. By contrast, with the step-down DC/DC converter shown in FIG. 1 according to the first embodiment of the present invention, an increase in the period for which the driving signal S2 output from the control circuit 10 remains at high level H is detected, and thus an overshoot in the output voltage Vo can be detected before a large rise occurs in the output voltage Vo.

Figure 3:
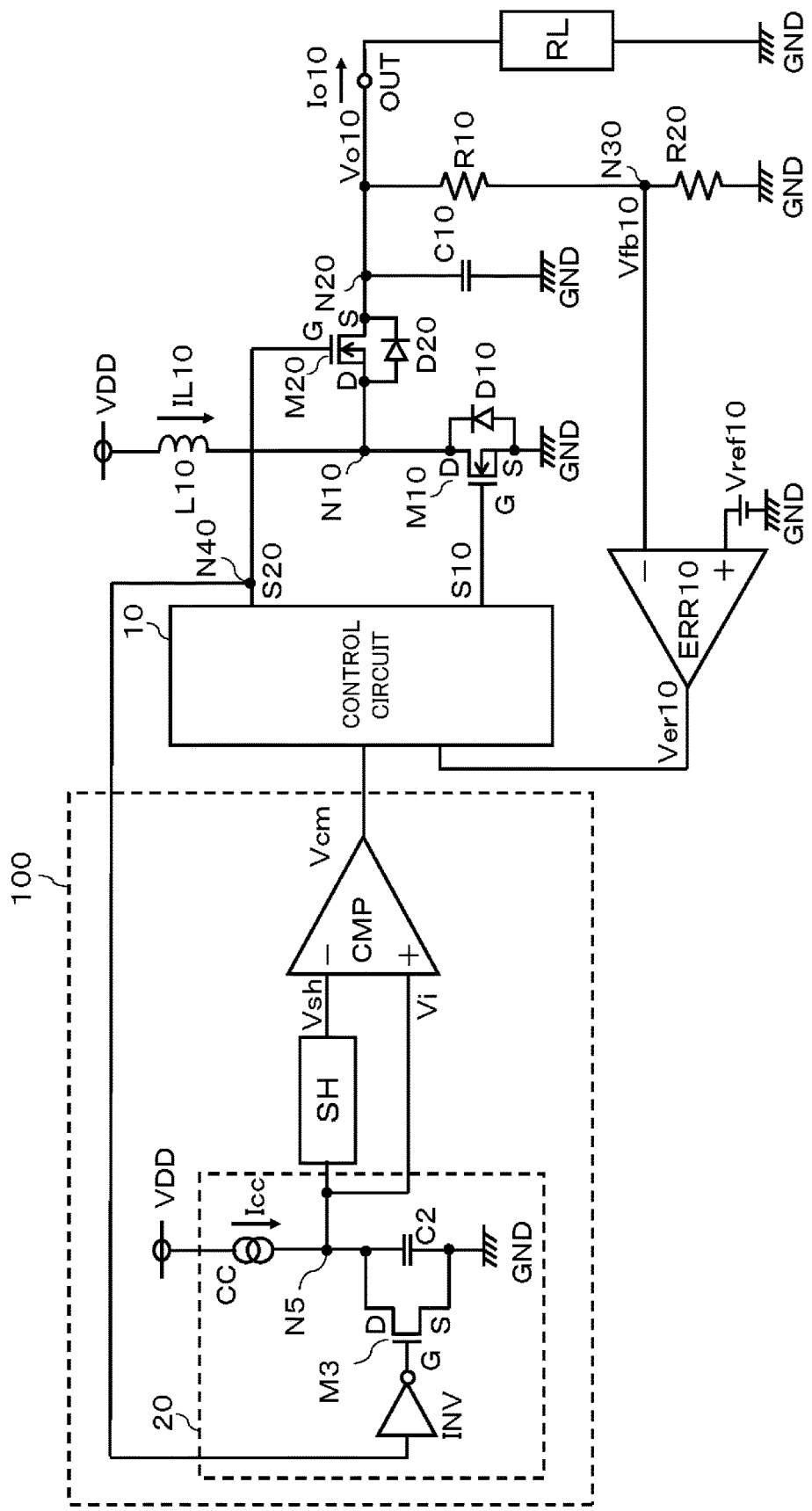
FIG. 3 is a circuit diagram of a power supply circuit according to a second embodiment of the present invention.

Second Embodiment: FIG. 3 is a circuit diagram of a power supply circuit according to a second embodiment of the present invention. The power supply circuit shown in FIG. 3 is a step-up DC/DC converter.

In FIG. 3, the power supply circuit is composed of an overshoot suppressor 100, a control circuit 10, a first transistor M10, a second transistor M20, an inductor L10, a capacitor C10, a resistor R10, a resistor R20, and an error amplifier ERR10. Between a source S and a drain D of the first transistor M10, a parasitic diode D10 is formed. Between a source S and a drain D of the second transistor M20, a parasitic diode D20 is formed. Driving signals S10 and S20 have a frequency of, for example, 100 kHz to 1 MHz. The inductor L10 has an inductance of, for example, 10 μH to several tens of microhenries. The capacitor C10 has a capacitance of, for example, several tens of microfarads to several hundred microfarads. The resistors R10 and R20 have a resistance of, for example, 1 kΩ to 1000 kΩ.

The first and second transistors M10 and M20 can both be NMOS transistors. Instead, the first transistor M10 may be a PMOS transistor and the second transistor M20 may be an NMOS transistor. In a case where the first transistor M10 is an NMOS transistor, the control circuit 10 includes a bootstrap circuit (unillustrated). The first and second transistors M10 and M20 may instead be bipolar transistors.

The overshoot suppressor 100 serves to control the second transistor M20. The overshoot suppressor 100 is composed of a pulse width-voltage converter 20, a sample-and-hold circuit SH, and a comparator CMP. The pulse width-voltage converter 20 is composed of an inverter INV, a third transistor M3, a capacitor C2, and a constant current source CC. The inverter INV functions as a polarity adjuster and as a buffer. A plurality of stages of inverters INV may be used, or no inverter at all may be used. Instead of the constant current source CC, a resistor may be used. The capacitor C2 has a capacitance of, for example, several picofarads to several tens of picofarads. The constant current source CC supplies a constant current Icc of, for example, several microamperes to several tens of microamperes.

Next, a description will be given of the circuit configuration of, and the component interconnection in, the power supply circuit shown in FIG. 3.

One output terminal of the control circuit 10 is connected to a gate G of the first transistor M10. Another output terminal of the control circuit 10 is connected via a node N40 to a gate G of the second transistor M20. The drain D of the first transistor M10 is connected to a node N10. The source S of the first transistor M10 is connected to a ground terminal GND. The drain D of the second transistor M20 is connected to the node N10. The source S of the second transistor M20 is connected to a node N20. The inductor L10 is connected between a power terminal VDD and the node N10. The capacitor C10 is connected between the node N20 and the ground terminal GND. The node N20 is connected to an output terminal OUT. To the output terminal OUT, a load RL is connected. Connected as the load RL is, for example, an LED.

The resistor R10 is connected between the node N20 and a node N30. The resistor R20 is connected between the node N30 and the ground terminal GND. An inverting input terminal (−) of the error amplifier ERR 10 is connected to the node N30. To a non-inverting input terminal (+) of the error amplifier ERR10, a reference voltage Vref10 is applied. An output terminal of the error amplifier ERR10 is connected to one input terminal of the control circuit 10.

An input terminal of the inverter INV is connected to the node N40. An output terminal of the inverter INV is connected to a gate G of the third transistor M3. Between a source S and the gate G of the third transistor M3, the capacitor C2 is connected. The source S of the third transistor M3 is connected to the ground terminal GND. A drain D of the third transistor M3 is connected to a node N5. The constant current source CC is connected between the power terminal VDD and the node N5. An input terminal of the sample-and-hold circuit SH and a non-inverting input terminal (+) of the comparator CMP are connected to the node N5. An output terminal of the sample-and-hold circuit SH is connected to an inverting input terminal (−) of the comparator CMP. An output terminal of the comparator CMP is connected to another input terminal of the control circuit 10. The third transistor M3, the capacitor C2, and the constant current source CC constitute an integrating circuit, and generate triangular or sawtooth waves. The integrating circuit may instead be configured as a so-called mirror integrating circuit that employs an operational amplifier.

Next, a description will be given of the signal flow in, and the circuit operation of, the power supply circuit shown in FIG. 3.

The control circuit 10 outputs driving signals S10 and S20. The driving signals S10 and S20 are fed to the gates G of the first and second transistors M10 and M20 respectively. Thus, the first and second transistors M10 and M20 are turned ON and OFF alternately.

When the first transistor M10 is ON and the second transistor M20 is OFF, the drain D-source S channel of the first transistor M10 conducts, and thus a current passes through the inductor L10. Thus, energy is stored in the inductor L10. When the first transistor M10 turns from ON to OFF, a back electromotive force causes a voltage to appear across the inductor Lb. When the second transistor M20 turns from OFF to ON, a current passes through the second transistor M20, and the capacitor C10 is charged. Also, a voltage which is the sum of the voltage at the power terminal VDD and the voltage ascribable to the back electromotive force is output to the output terminal OUT. Thereafter, when the first transistor M10 turns from OFF to ON and the second transistor M20 turns from ON to OFF, energy is stored in the inductor L10. At this time, through the discharging of the capacitor C10, a voltage Vo10 higher than the voltage at the power terminal VDD is output to the output terminal OUT. The operation described thus far is repeated so that the output voltage Vo10 is raised.

The output voltage Vo10 at the output terminal OUT is divided by the resistors R10 and R20, and thereby a feedback voltage Vfb10 is produced at the node N30. The error amplifier ERR10 compares the feedback voltage Vfb10 with the reference voltage Vref10, and outputs a control signal Ver10 that reflects the result of the comparison. Based on the control signal Ver10, the control circuit 10 controls the driving signals S1 and S2 to give them a predetermined pulse width, and outputs the so controlled driving signals S1 and S2 to turn ON and OFF the first and second transistors M10 and M20 alternately.

The driving signal S20 output from the control circuit 10 is fed also to the inverter INV, where it is inverted. The output signal of the inverter INV is fed to the gate G of the third transistor M3. Based on the output signal of the inverter INV, the third transistor M3, the capacitor C2, and the constant current source CC generate an integral signal Vi at the node N5. The integral signal Vi is fed to the input terminal of the sample-and-hold circuit SH and to the non-inverting input terminal (+) of the comparator CMP. The sample-and-hold circuit SH holds the peak value of the integral signal Vi fed to it, and outputs, as a held signal Vsh, the value that was held last time. The held signal Vsh is fed to the inverting input terminal (−) of the comparator CMP. The comparator CMP compares the integral signal Vi with the held signal Vsh, and outputs a detection signal Vcm that is either at low level L or at high level H at a time. The detection signal Vcm is fed to the control circuit 10.

When the integral signal Vi rises above the held signal Vsh, the detection signal Vcm turns to high level H. When the integral signal Vi is equal to or lower than the held signal Vsh, the detection signal Vcm is at low level L. When the detection signal Vcm turns to high level H, the control circuit 10 turns the driving signal S2 to low level L to forcibly turn OFF the second transistor M20. Thus, the second transistor M20 is forcibly turned OFF. On the other hand, when the detection signal Vcm is at low level L, the first and second transistors M10 and M20 keep turning ON and OFF complementarily. Here, "complementarily" is assumed to cover not only operation where the ON/OFF states of the first and second transistors M10 and M20 are completely reversed, but also operation where, with a view to preventing a through current, the first and second transistors M10 and M20 are shifted between the ON and OFF states with a delay with respect to each other.

When the load RL connected to the output terminal OUT turns sharply from a heavy load to a light or no load, the output current Io10 that passes through the output terminal OUT decreases. Accordingly, the output voltage Vo10 at the output terminal OUT rises, and the feedback voltage Vfb10 rises. When the feedback voltage Vfb10 exceeds the reference voltage Vref10, the control signal Ver10 of the error amplifier ERR turns to low level L. Thus, the control circuit 10 turns the driving signal S2 to high level H. As a result, the second transistor M2 turns ON. Moreover, the output signal of the inverter INV turns to low level L, and thus the third transistor M3 turns OFF. Now, the constant current Icc from the constant current source CC charges the capacitor C2. Thus, the level of the integral signal Vi rises. The sample-and-hold circuit SH holds the peak value of the integral signal Vi, and outputs the previously held value as the held signal Vsh. The comparator CMP compares the integral signal Vi with the held signal Vsh, and turns the detection signal Vcm to high level H when the integral signal Vi exceeds the held signal Vsh. Thus, the control circuit 10 turns the driving signal S20 to low level L. Thus, the second transistor M2 is forcibly turned OFF. As a result, the output current Io10 passing through the output terminal OUT decreases, and thereby an overshoot in the output voltage Vo is suppressed. That is, when the load becomes light, the ON-period of the second transistor M20 increases. The overshoot suppressor 100 detects the increase in the ON-period of the second transistor M20, and then forcibly turns OFF the second transistor M20. In this way, an overshoot in the output voltage Vo10 is suppressed.

When the load RL connected to the output terminal OUT changes gently from a heavy load to a light or no load, the level of the held signal Vsh output from the sample-and-hold circuit SH, which has the previously held value, is almost equal to the level of the integral signal Vi, and thus the comparator CMP holds the detection signal Vcm at low level L. Thus, the second transistor M20 is not forcibly turned OFF. Thus, when the output voltage Vo10 changes gently due to normal operation of the load RL connected to the output terminal OUT, the second transistor M20 is not forcibly turned OFF. Incidentally, if the second transistor M20 is forcibly turned OFF as a result of a change in the output voltage Vo10 due to normal operation of the load RL, the feedback voltage Vfb10 falls below the reference voltage Vref10, and thereby the second transistor M20 recovers from the OFF state.

The overshoot suppressor 100 disclosed herein may be applied to a power supply circuit that is switchable between step-up and step-down operation.

Synopsis: To follow is a synopsis of the embodiments described above.

According to one aspect of what is disclosed herein, a power supply circuit includes: a first transistor connected between a high-potential terminal and a first node; a second transistor connected between a low-potential terminal and the first node; and a smoothing circuit connected between the first node and the low-potential terminal. The power supply circuit may moreover include a control circuit configured to turn ON and OFF the first and second transistors alternately such that the output voltage at an output terminal connected to the smoothing circuit equals a predetermined voltage. The power supply circuit may further include an overshoot suppressor configured to turn OFF the second transistor on detecting an increase in the ON-period of the second transistor as observed when the second transistor is turned ON this time compared with the ON-period of the second transistor as observed when the second transistor was turned ON last time.

According to another aspect of what is disclosed herein, a power supply circuit, includes: an inductor connected between a high-potential terminal and a first node; a first transistor connected between a low-potential terminal and the first node; a second transistor connected between the first node and an output terminal; and a first capacitor connected between the output terminal and the low-potential terminal. The power supply circuit may moreover include a control circuit configured to turn ON and OFF the first and second transistors alternately such that the output voltage at the output terminal equals a predetermined voltage. The power supply circuit may further include an overshoot suppressor configured to turn OFF the second transistor on detecting an increase in the ON-period of the second transistor as observed when the second transistor is turned ON this time compared with the ON-period of the second transistor as observed when the second transistor was turned ON last time.

The overshoot suppressor may include a pulse width-voltage converter configured to convert the ON-period of the second transistor as observed when the second transistor is turned ON into a voltage. The overshoot suppressor may include a holder configured to hold the peak value of the voltage generated by the pulse width-voltage converter and to output the voltage that was held last time. The overshoot suppressor may include a comparator configured to compare the voltage generated by the pulse width-voltage converter with the voltage output from the holder to output the result of the comparison. The control circuit may turn OFF the second transistor based on the result of the comparison.

The control circuit may turn ON and OFF the second transistor by feeding the second transistor with a control signal. The pulse width-voltage converter may include: a second capacitor; a current supplier configured to supply the second capacitor with a current; and a switch configured to be turned ON and OFF by the control signal fed from the control circuit to the second transistor. The second capacitor may be charged by the current supplier when the switch is OFF, and may be discharged via the switch when the switch is ON.

The current supplier may include a constant current source.

The current supplier may include a first resistor.

The switch may include a third transistor.

The holder may include a sample-and-hold circuit.

The power supply circuit may further include: an error amplifier configured to compare the output voltage at the output terminal, or a first voltage having a predetermined relationship with the output voltage at the output terminal, with a reference voltage. The control circuit may turn ON and OFF the first and second transistors alternately such that the output voltage at the output terminal equals the predetermined voltage based on the result of the comparison by the error amplifier.

The power supply circuit may further include: second and third resistors that produce the first voltage by dividing the output voltage. The error amplifier may compare the first voltage with the reference voltage so that the control circuit may turn the first transistor OFF and the second transistor ON when the first voltage exceeds the reference voltage and may keep the first transistor ON and the second transistor OFF when the first voltage is equal to or lower than the reference voltage.

Advantageous Effect: According to what is disclosed herein, it is possible to provide a power supply circuit that is free of malfunctioning due to noise, that operates with a suppressed overshoot, and that offers fast response to a variation in load.

Industrial Applicability: The invention disclosed herein finds application in power supplies for PCs, power supplies for servers, power supplies of FPGAs, power supplies for SOCs, power supplies for OA appliances, etc. Thus, the invention disclosed herein has high industrial applicability.

What is claimed is:

1. A power supply circuit, comprising:
    a first transistor connected between a high-potential terminal and a first node;
    a second transistor connected between a low-potential terminal and the first node;
    a smoothing circuit connected between the first node and the low-potential terminal;
    a control circuit configured to turn ON and OFF the first and second transistors alternately such that an output voltage at an output terminal connected to the smoothing circuit equals a predetermined voltage; and
    an overshoot suppressor configured to detect an increase in an ON-period of the second transistor when the second transistor is turned ON this time compared with an ON-period of the second transistor when the second transistor was turned ON last time,
    wherein the control circuit forcibly turns OFF the second transistor in response to the detection by the overshoot suppressor.

2. The power supply circuit of claim 1, wherein the overshoot suppressor includes:
    a pulse width-voltage converter configured to convert the ON-period of the second transistor as observed when the second transistor is turned ON into a voltage;
    a holder configured to hold a peak value of the voltage generated by the pulse width-voltage converter and to output a voltage that was held last time; and
    a comparator configured to compare the voltage generated by the pulse width-voltage converter with the voltage output from the holder to output a result of the comparison, and
    the control circuit turns OFF the second transistor based on the result of the comparison.

3. The power supply circuit of claim 2, wherein
    the control circuit turns ON and OFF the second transistor by feeding the second transistor with a control signal,
    the pulse width-voltage converter includes:
        a second capacitor;
        a current supplier configured to supply the second capacitor with a current; and
        a switch configured to be turned ON and OFF by the control signal fed from the control circuit to the second transistor, and the second capacitor is charged by the current supplier when the switch is OFF, and the second capacitor is discharged via the switch when the switch is ON.

4. The power supply circuit of claim 3, wherein the current supplier includes a constant current source.

5. The power supply circuit of claim 3, wherein the current supplier includes a first resistor.

6. The power supply circuit of claim 3, wherein the switch includes a third transistor.

7. The power supply circuit of claim 2, wherein the holder includes a sample-and-hold circuit.

8. The power supply circuit of claim 1, further comprising:
an error amplifier configured to compare the output voltage at the output terminal, or a first voltage having a predetermined relationship with the output voltage at the output terminal, with a reference voltage, wherein
the control circuit turns ON and OFF the first and second transistors alternately such that the output voltage at the output terminal equals the predetermined voltage based on a result of the comparison by the error amplifier.

9. The power supply circuit of claim 8, further comprising:
second and third resistors that produce the first voltage by dividing the output voltage, wherein
the error amplifier compares the first voltage with the reference voltage, and
the control circuit turns the first transistor OFF and the second transistor ON when the first voltage exceeds the reference voltage, and keeps the first transistor ON and the second transistor OFF when the first voltage is equal to or lower than the reference voltage.

10. A power supply circuit, comprising:
an inductor connected between a high-potential terminal and a first node;
a first transistor connected between a low-potential terminal and the first node;
a second transistor connected between the first node and an output terminal;
a first capacitor connected between the output terminal and the low-potential terminal,
a control circuit configured to turn ON and OFF the first and second transistors alternately such that an output voltage at the output terminal equals a predetermined voltage; and
an overshoot suppressor configured to detect an increase in an ON-period of the second transistor when the second transistor is turned ON this time compared with an ON-period of the second transistor when the second transistor was turned ON last time,
wherein the control circuit forcibly turns OFF the second transistor in response to the detection by the overshoot suppressor.

11. The power supply circuit of claim 10, wherein the overshoot suppressor includes:

a pulse width-voltage converter configured to convert the ON-period of the second transistor as observed when the second transistor is turned ON into a voltage;
a holder configured to hold a peak value of the voltage generated by the pulse width-voltage converter and to output a voltage that was held last time; and
a comparator configured to compare the voltage generated by the pulse width-voltage converter with the voltage output from the holder to output a result of the comparison, and
the control circuit turns OFF the second transistor based on the result of the comparison.

12. The power supply circuit of claim 11, wherein
the control circuit turns ON and OFF the second transistor by feeding the second transistor with a control signal,
the pulse width-voltage converter includes:
a second capacitor;
a current supplier configured to supply the second capacitor with a current; and
a switch configured to be turned ON and OFF by the control signal fed from the control circuit to the second transistor, and
the second capacitor is charged by the current supplier when the switch is OFF, and the second capacitor is discharged via the switch when the switch is ON.

13. The power supply circuit of claim 12, wherein the current supplier includes a constant current source.

14. The power supply circuit of claim 12, wherein the current supplier includes a first resistor.

15. The power supply circuit of claim 12, wherein the switch includes a third transistor.

16. The power supply circuit of claim 11, wherein the holder includes a sample-and-hold circuit.

17. The power supply circuit of claim 10, further comprising:
an error amplifier configured to compare the output voltage at the output terminal, or a first voltage having a predetermined relationship with the output voltage at the output terminal, with a reference voltage, wherein
the control circuit turns ON and OFF the first and second transistors alternately such that the output voltage at the output terminal equals the predetermined voltage based on a result of the comparison by the error amplifier.

18. The power supply circuit of claim 17, further comprising:
second and third resistors that produce the first voltage by dividing the output voltage, wherein
the error amplifier compares the first voltage with the reference voltage, and
the control circuit turns the first transistor OFF and the second transistor ON when the first voltage exceeds the reference voltage, and keeps the first transistor ON and the second transistor OFF when the first voltage is equal to or lower than the reference voltage.

* * * * *